(12) United States Patent
Chen

(10) Patent No.: US 10,910,330 B2
(45) Date of Patent: Feb. 2, 2021

(54) PAD STRUCTURE AND INTEGRATED CIRCUIT DIE USING THE SAME

(71) Applicant: MEDIATEK INC., Hsin-Chu (TW)

(72) Inventor: Chun-Liang Chen, Zhubei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/892,460

(22) Filed: Feb. 9, 2018

(65) Prior Publication Data
US 2018/0261561 A1    Sep. 13, 2018

Related U.S. Application Data

(60) Provisional application No. 62/470,422, filed on Mar. 13, 2017.

(51) Int. Cl.
*H01L 23/00* (2006.01)

(52) U.S. Cl.
CPC ............ *H01L 24/05* (2013.01); *H01L 23/562* (2013.01); *H01L 24/48* (2013.01);
(Continued)

(58) Field of Classification Search
CPC ............... H01L 24/05; H01L 23/562; H01L 2224/05093; H01L 2224/05099; H01L 2924/00014; H01L 2224/05085; H01L 2224/02166; H01L 2924/301; H01L 2224/04042; H01L 2924/10253; H01L 2924/14; H01L 24/48; H01L 2224/48091; H01L 2224/48106; H01L 2224/48227; H01L 2224/05573; H01L 2224/0557; H01L 2224/05553; H01L 2224/05551;
(Continued)

(56) References Cited

U.S. PATENT DOCUMENTS 6,313,537 B1 * 11/2001 Lee .................. H01L 43/03
                                                                    257/758
7,057,296 B2 * 6/2006 Hung .................. H01L 24/05
                                                                    257/786
(Continued)

FOREIGN PATENT DOCUMENTS

CN          1612333 A       5/2005
CN        101159252 A       4/2008
(Continued)

OTHER PUBLICATIONS

EPO Search Report dated Jul. 31, 2018 in EP application (No. 18158685.0-1212).
(Continued)

*Primary Examiner* — Benjamin Tzu-Hung Liu
(74) *Attorney, Agent, or Firm* — Wolf, Greenfield & Sacks, P.C.

(57) ABSTRACT

A pad structure is formed on an IC die and includes a first conductive layer, a dielectric layer, a second conductive layer and a passivation layer. The first conductive layer is formed on an upper surface of the IC die and having a hollow portion. The dielectric layer covers the first conductive layer. The second conductive layer is formed on the dielectric layer and electrically connected to the first conductive layer. The passivation layer covers the second conductive layer and has an opening exposing the second conductive layer for receiving a bonding wire.

8 Claims, 3 Drawing Sheets

(52) U.S. Cl.
CPC ............... *H01L 2224/02166* (2013.01); *H01L 2224/04042* (2013.01); *H01L 2224/0557* (2013.01); *H01L 2224/05076* (2013.01); *H01L 2224/05085* (2013.01); *H01L 2224/05093* (2013.01); *H01L 2224/05099* (2013.01); *H01L 2224/05147* (2013.01); *H01L 2224/05551* (2013.01); *H01L 2224/05553* (2013.01); *H01L 2224/05573* (2013.01); *H01L 2224/05624* (2013.01); *H01L 2224/48091* (2013.01); *H01L 2224/48106* (2013.01); *H01L 2224/48227* (2013.01); *H01L 2924/00014* (2013.01); *H01L 2924/10253* (2013.01); *H01L 2924/14* (2013.01); *H01L 2924/301* (2013.01); *H01L 2924/3512* (2013.01)

(58) Field of Classification Search
CPC . H01L 2224/05147; H01L 2224/05624; H01L 2924/3512; H01L 2224/05076; H01L 23/488
See application file for complete search history.

(56) References Cited

U.S. PATENT DOCUMENTS

| | | | |
|---|---|---|---|
| 7,102,312 B2 | 9/2006 | Suzuki et al. | |
| 7,385,297 B1* | 6/2008 | Gumaste | ................ H01L 24/05 257/784 |
| 7,397,127 B2* | 7/2008 | Lin | ......................... H01L 24/03 257/773 |
| 2002/0000668 A1 | 1/2002 | Sakihama et al. | |
| 2005/0093176 A1 | 5/2005 | Hung et al. | |
| 2005/0245050 A1* | 11/2005 | Tsao | ........................ H01L 24/05 438/460 |
| 2006/0091536 A1 | 5/2006 | Huang et al. | |
| 2006/0154469 A1* | 7/2006 | Hess | ..................... H01L 23/522 438/618 |
| 2006/0180946 A1* | 8/2006 | Chen | ....................... H01L 24/05 257/786 |
| 2007/0205508 A1 | 9/2007 | Hsia et al. | |
| 2008/0083992 A1 | 4/2008 | Lin et al. | |
| 2009/0176124 A1* | 7/2009 | Hong | ..................... B32B 15/01 428/620 |

FOREIGN PATENT DOCUMENTS

| | | |
|---|---|---|
| CN | 104576582 A | 4/2015 |
| JP | 2011066459 A | 3/2011 |
| TW | 200403920 A | 3/2004 |

OTHER PUBLICATIONS

TIPO Office Action dated Jan. 25, 2019 in Taiwan application (No. 107108330).
TIPO Office Action dated Jul. 23, 2019, Taiwan Application No. 107108330, pp. 1-8.
CN Office Action dated Jul. 2, 2019 by China National Intellectual Property Administration, Application No. 201810201455.8, pp. 1-9.

* cited by examiner

PAD STRUCTURE AND INTEGRATED CIRCUIT DIE USING THE SAME

This application claims the benefit of U.S. Provisional application Ser. No. 62/470,422, filed Mar. 13, 2017, the disclosure of which is incorporated by reference herein in its entirety.

FIELD OF THE INVENTION

The invention relates to a pad structure and an integrated circuit (IC) die using the same, and more particularly to a pad structure including a conductive layer having a hollow portion and an IC die using the same.

BACKGROUND OF THE INVENTION

Conventional IC die includes a pad structure for receiving a bonding wire. During the bonding wire being bonded to the pad structure, the bonding force possibly causes the damage of the pad structure. In particular, when the pad structure includes an UTM (ultra thick metal) layer, due to mechanical stress of the UTM layer, the pad structure is more likely to damage during wire bonding.

SUMMARY OF THE INVENTION

In one embodiment of the invention, a pad structure is provided. The pad structure is formed on an IC die and includes a first conductive layer, a dielectric layer, a second conductive layer and a passivation layer. The first conductive layer is formed on an upper surface of the IC die and having a hollow portion. The dielectric layer covers the first conductive layer. The second conductive layer is formed on the dielectric layer and electrically connected to the first conductive layer. The passivation layer covers the second conductive layer and has an opening exposing the second conductive layer for receiving a bonding wire.

In another embodiment of the invention, an IC die is provided. The IC die includes silicon substrate and a pad structure. The pad structure is formed on the silicon substrate. The pad structure includes a first conductive layer, a dielectric layer, a second conductive layer and a passivation layer. The first conductive layer is formed on an upper surface of the IC die and having a hollow portion. The dielectric layer covers the first conductive layer. The second conductive layer is formed on the dielectric layer and electrically connected to the first conductive layer. The passivation layer covers the second conductive layer and has an opening exposing the second conductive layer for receiving a bonding wire.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which.

DETAILED DESCRIPTION OF PREFERRED EMBODIMENTS

Figure 1:
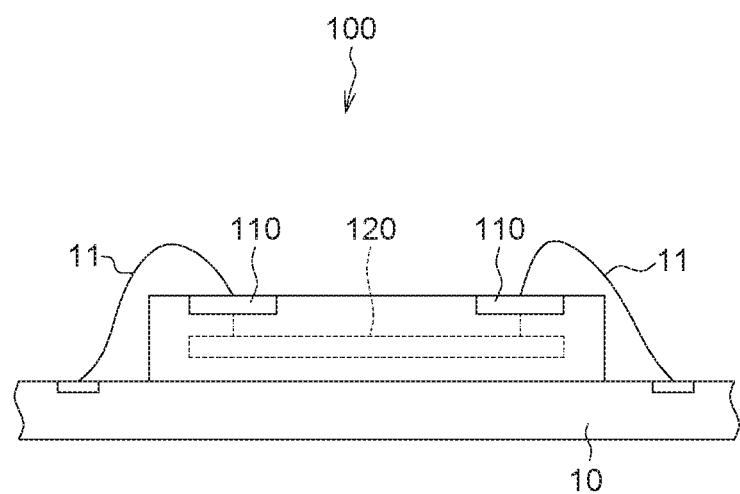
FIG. 1 illustrates a diagram of an IC die disposed on a substrate according to an embodiment of the invention.
Figure 2A:
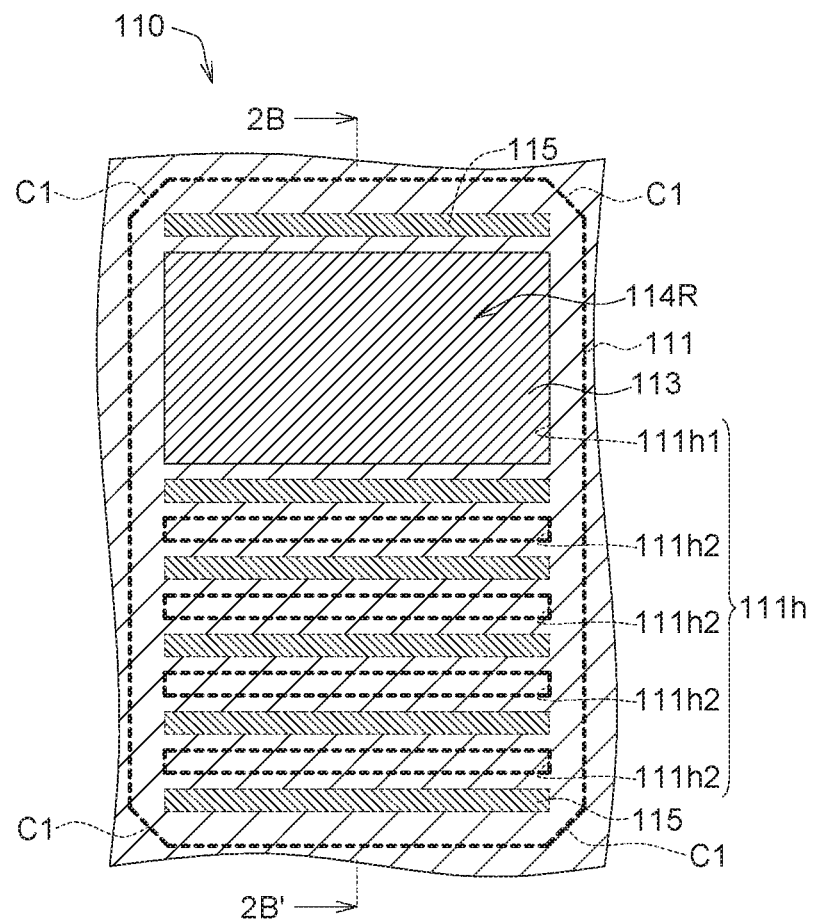
FIG. 2A illustrates a top view of the pad structure of FIG. 1.
Figure 2B:
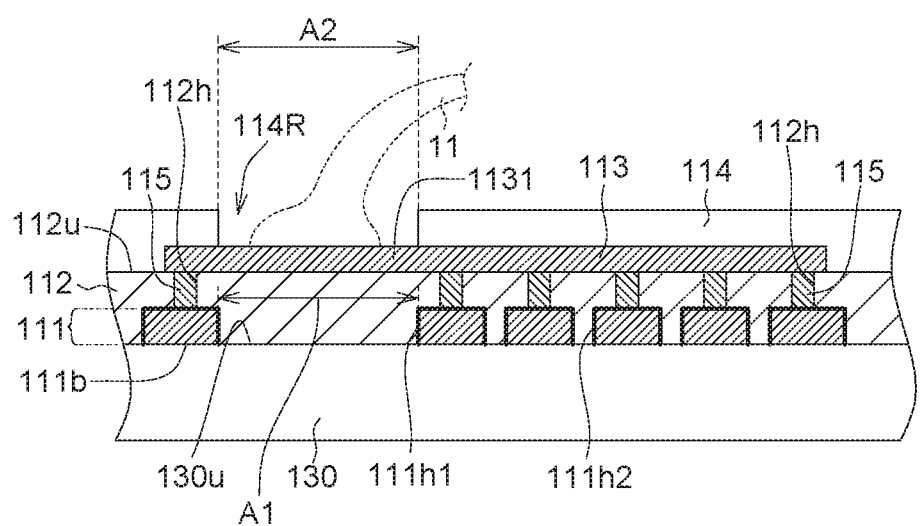
FIG. 2B illustrates a cross-sectional view of the pad structure of FIG. 2A along a direction 2B-2B'.

Referring to FIGS. 1, 2A and 2B, FIG. 1 illustrates a diagram of an IC die 100 disposed on a substrate 10 according to an embodiment of the invention, FIG. 2A illustrates a top view of the pad structure 110 of FIG. 1, and FIG. 2B illustrates a cross-sectional view of the pad structure 110 of FIG. 2A along a direction 2B-28'.

The IC die 100 is disposed on the substrate 10 and electrically connects with the substrate 10 through at least one bonding wire 11. The substrate 10 is, for example, a printed circuit board (PCB), a chip, a semiconductor package device, etc. The IC die 100 includes least one pad structure 110, at least one semiconductor structure 120 and a silicon substrate 130. The semiconductor structure 120 is electrically connected with the substrate 10 through the pad structure 110 and the bonding wire 11. The semiconductor structure 120 is formed on the silicon substrate 130 and includes, for example, at least one active component (for example, transistor) and/or at least one passive component. The semiconductor structure 120 is electrically connected with the pad structure 110.

As illustrated in FIG. 2B, the pad structure 110 is formed on the silicon substrate 130. The pad structure 110 includes a first conductive layer 111, a dielectric layer 112, a second conductive layer 113, a passivation layer 114 and at least one conductive portion 115. In an embodiment, the first conductive layer 111 and the conductive portion 115 may be made of, for example, copper. The second conductive layer 113 is the uppermost layer of these conductive layers and is made of, for example, aluminum.

As illustrated in FIG. 2B, the first conductive layer 111 is formed on an upper surface 130u of the silicon substrate 130 and has at least one hollow portion 111h. The first conductive layer 111 is directly formed on the upper surface 130u of the silicon substrate 130. The first conductive layer 111 has a lower surface 111b aligned with the upper surface 130u of the silicon substrate 130.

As illustrated in FIG. 2B, the dielectric layer 112 is formed on the upper surface 130u of the silicon substrate 130 and covers the first conductive layer 111. The second conductive layer 113 is formed on an upper surface 112u of the dielectric layer 112 and electrically connected to the first conductive layer 111 through a plurality of the conductive portions 115. The passivation layer 114 is formed on the dielectric layer 112 and covers the second conductive layer 113. The passivation layer 114 has an opening 1148 exposing a portion 1131 of the second conductive layer 113 for receiving the corresponding bonding wire 11.

Due to the first conductive layer 111 having the hollow portion 111h, the mechanical stress of the first conductive layer 111 may be released. Furthermore, when the bonding wire 11 is bonded to the portion 1131 of the second conductive layer 113, it is not easy for the first conductive layer 111 to be damaged, for example, crack. In an embodiment, the first conductive layer 111 is an UTM layer having a thickness larger than 20 K Å. Due to the first conductive layer 111 having the hollow portion 111h, even if the first conductive layer 111 is the UTM layer, it is not easy for the first conductive layer 111 to be damaged when the bonding wire 11 is bonded to the portion 1131 of the second conductive layer 113.

In addition, the hollow portions 111h include a first hollow 111h1 and a plurality of second hollows 111h2, wherein the first hollow 111h1 is corresponding to the opening 114R upper and down, and the second hollows 111h2 are corresponding to the passivation layer 114 upper and down. As illustrated in FIGS. 2A and 2B, the first hollow 111h1 has a top-viewed area A1 equal to a top-viewed area A2 of the opening 114R. In another embodiment, the top-viewed area A1 of the first hollow 111h1 is less or larger than the top-viewed area A2 of the opening 114R. As illustrated in FIG. 2A, each second hollow 111h2 is strip-shape extending along direction of the upper surface 130u of the silicon substrate 130; however, such exemplification is not meant to be for limiting.

The first hollow 111h1 can effectively avoid the damage of the first conductive layer 111. Furthermore, when the bonding wire 11 is bonded to the portion 1131 exposed from the opening 114B, the region of the first hollow 111h1 sustains larger or largest bonding force during wire bonding. Due to the first hollow 111h1, the mechanical stress of the first conductive layer 111 is effectively released, and accordingly it is not easy for the first conductive layer 111 to be damaged by the larger or largest bonding force. As a result, the reliability and/or the yield of the IC die 100 can be increased.

As illustrated in FIG. 2B, the pad structure 110 has at least one through hole 112h passing through the dielectric layer 112 from the upper surface 112u of the dielectric layer 112 to the first conductive layer 111. Each through hole 112h is filled with the corresponding conductive portion 115. The conductive portion 115 connects the first conductive layer 111 with the second conductive layer 113.

As illustrated in FIGS. 2A and 2B, each conductive portion 115 is strip-shape extending along direction of the upper surface 130u of the silicon substrate 130. The conductive portions 115 can provide a sufficient area for enhancing EM (electromagnetic) performance. Furthermore, the conductive portions 115 provide sufficient flowing area for current applied to the bonding wire 11, and accordingly it can prevent the pad structure 110 from being burn out. Since the conductive portion 115 can maintain or enhance EM performance, the crack issue can be solved without sacrificing EM performance.

As illustrated in FIG. 2A, the first conductive layer 111 has a plurality of chamfers C1 formed on a plurality of corners of the first conductive layer 111. The chamfers C1 may reduce the area of the first conductive layer 111, such that the pad structure 110 becomes a compact pad. Although not illustrated, the second conductive layer 113 also has a plurality of chamfers formed on a plurality of corners of the second conductive layer 113. In addition, the contour of the top-viewed area of the first conductive layer 111 has a shape similar to or the same as that of the second conductive layer 113.

In addition, as illustrated in FIG. 2B, at least one outer lateral surface (boundary) of the second conductive layer 113 is recessed with respect to at least one outer lateral surface (boundary) of the first conductive layer 111. In another embodiment, at least one outer lateral surface of the second conductive layer 113 is projected with respect to at least one outer lateral surface of the first conductive layer 111, or at least one outer lateral surface of the second conductive layer 113 is aligned with at least one outer lateral surface of the first conductive layer 111.

Figure 3:
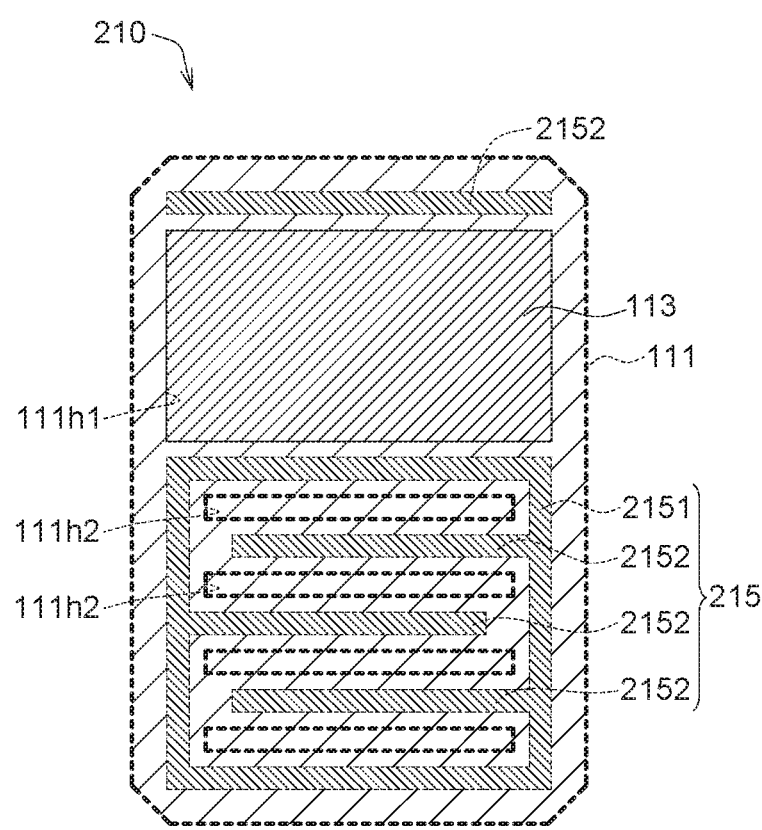
FIG. 3 illustrates a diagram of a pad structure according to another embodiment of the invention.

FIG. 3 illustrates a diagram of a pad structure 210 according to another embodiment of the invention. The pad structure 210 includes the first conductive layer 111, the dielectric layer 112 (not illustrated), the second conductive layer 113, the passivation layer 114 (not illustrated) and at least one conductive portion 215. In the present embodiment, the conductive portion 215 includes a ring portion 2151 and a plurality of strip portion 2152 connecting with the ring portion 2151. The ring portion 2151 may be a close ring portion or an open ring portion. In another embodiment, at least one of the strip portions 2152 may be separated from the ring portion 2151. In other embodiment, the conductive portion 215 may extend in straight line, a curved line or combination thereof.

In another embodiment, the first conductive layer has at least one hollow portion, wherein the cross-sectional shape/extension form of the hollow portion may be strip-shape, dotted shape, circular shape, polygonal shape, ring-shape, etc. The cross-sectional shapes/extension forms of the hollow portions may be identical or different. As long as the first conductive layer may release the mechanical stress to prevent the pad structure from being damaged during wire-bonding, the present embodiment of the invention does not limit the cross-sectional shape/extension form of the hollow portion. In addition, the number of the hollow portions is not limited to embodiment of the invention.

In another embodiment, the pad structure includes at least one conductive portion, wherein the conductive portion may be strip-shape, dotted shape, circular shape, polygonal shape, ring-shape, etc. The cross-sectional shapes/extension forms of the conductive portions may be identical or different. As long as the conductive portion may maintain or enhance EM performance, the present embodiment of the invention does not limit the cross-sectional shape/extension form of the conductive portion. In addition, the number of the conductive portions is not limited to embodiment of the invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A pad structure formed on an integrated circuit (IC) die, comprising:
   a first conductive layer formed directly on an upper surface of the IC die and having a hollow portion;
   a dielectric layer covering the first conductive layer;
   a second conductive layer formed on the dielectric layer and electrically connected to the first conductive layer; and
   a passivation layer covering the second conductive layer and having an opening exposing the second conductive layer for receiving a bonding wire;
   wherein the entire opening overlaps the entire hollow portion,
   wherein the first conductive layer has a first portion and a second portion separated from the second portion, and the pad structure further comprises:
   a first conductor electrically connecting the first portion of the first conductive layer to the second conductive layer; and a second conductor electrically connecting the second portion of the first conductive layer to the second conductive layer, wherein the first conductor is narrower than the first portion of the first conductive layer in cross section, and wherein the first and second conductors are disposed at a same side of the hollow portion.

2. The pad structure as claimed in claim 1, wherein the first conductive layer is directly formed on an upper surface of a silicon substrate of the IC die.

3. The pad structure as claimed in claim 1, wherein the first conductive layer has a lower surface aligned with an upper surface of a silicon substrate of the IC die.

4. The pad structure as claimed in claim 1, wherein the first conductor is strip-shaped.

5. The pad structure as claimed in claim 1, wherein the hollow portion is filled with the dielectric layer.

6. The pad structure as claimed in claim 1, wherein the first conductor extends in straight line, a curved line or combination thereof.

7. The pad structure as claimed in claim 1, wherein the first conductor includes a ring portion and a plurality of strip portions connecting with the ring portion.

8. The pad structure as claimed in claim 1, wherein the first conductive layer has a plurality of chamfers formed on a plurality of corners of the first conductive layer.

* * * * *